United States Patent
Bailey et al.

(10) Patent No.: US 8,025,812 B2
(45) Date of Patent: Sep. 27, 2011

(54) SELECTIVE ETCH OF TIW FOR CAPTURE PAD FORMATION

(75) Inventors: Carla A. Bailey, Poughkeepsie, NY (US); Camille P. Bowne, Poughkeepsie, NY (US); Krystyna W. Semkow, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 1022 days.

(21) Appl. No.: 11/741,017

(22) Filed: Apr. 27, 2007

(65) Prior Publication Data
US 2008/0264898 A1   Oct. 30, 2008

(51) Int. Cl.
*C09K 13/06* (2006.01)
*C25F 3/12* (2006.01)

(52) U.S. Cl. .................. 252/79.1; 216/13; 216/100
(58) Field of Classification Search .................. None
See application file for complete search history.

(56) References Cited

U.S. PATENT DOCUMENTS

| | | | | |
|---|---|---|---|---|
| 3,888,702 A * | 6/1975 | Kujawa et al. | ........... | 148/273 |
| 4,353,779 A * | 10/1982 | Przybysz | ........... | 438/745 |
| 4,554,050 A | 11/1985 | Minford et al. | | |
| 4,671,852 A | 6/1987 | Pyke | | |
| 4,814,293 A | 3/1989 | Van Oekel | | |
| 4,966,715 A * | 10/1990 | Ahsan et al. | ........... | 210/721 |
| 5,041,191 A | 8/1991 | Watson | | |
| 5,130,275 A | 7/1992 | Dion | | |
| 5,232,815 A * | 8/1993 | Browne et al. | ........... | 430/191 |
| 5,462,638 A | 10/1995 | Datta et al. | | |
| 5,800,726 A | 9/1998 | Cotte et al. | | |
| 5,972,123 A | 10/1999 | Verhaverbeke | | |
| 6,838,009 B2 | 1/2005 | Arvin et al. | | |
| 7,105,889 B2 * | 9/2006 | Bojarczuk et al. | ........... | 257/324 |
| 7,338,908 B1 * | 3/2008 | Koos et al. | ........... | 438/745 |
| 7,452,767 B2 * | 11/2008 | Bojarczuk et al. | ........... | 438/216 |
| 7,479,683 B2 * | 1/2009 | Bojarczuk et al. | ........... | 257/410 |
| 7,531,463 B2 * | 5/2009 | Koos et al. | ........... | 438/754 |
| 2001/0037995 A1 * | 11/2001 | Akatsu et al. | ........... | 216/100 |
| 2004/0079188 A1 * | 4/2004 | Mori et al. | ........... | 75/230 |
| 2005/0269634 A1 * | 12/2005 | Bojarczuk et al. | ........... | 257/338 |
| 2005/0269635 A1 * | 12/2005 | Bojarczuk et al. | ........... | 257/338 |
| 2006/0275977 A1 * | 12/2006 | Bojarczuk et al. | ........... | 438/216 |
| 2007/0105377 A1 * | 5/2007 | Koos et al. | ........... | 438/689 |
| 2008/0264898 A1 * | 10/2008 | Bailey et al. | ........... | 216/13 |
| 2009/0011610 A1 * | 1/2009 | Bojarczuk et al. | ........... | 438/763 |
| 2009/0152642 A1 * | 6/2009 | Bojarczuk et al. | ........... | 257/369 |
| 2009/0277867 A1 * | 11/2009 | Mayer et al. | ........... | 216/13 |
| 2009/0280243 A1 * | 11/2009 | Mayer et al. | ........... | 427/154 |
| 2009/0280649 A1 * | 11/2009 | Mayer et al. | ........... | 438/676 |

OTHER PUBLICATIONS

Kagawa et al., Chemical Etching of Germanium with H3PO4-H2O2-H2O Solutions, Japanese Journal of Applied Physics, vol. 21, No. 11, Nov. 1982, pp. 1616-1618.*
International Search Report dated Jul. 2, 2008.

* cited by examiner

*Primary Examiner* — Allan Olsen
(74) *Attorney, Agent, or Firm* — DeLio & Peterson, LLC; Kelly M. Nowak; Joseph Petrokaitis

(57) ABSTRACT

A chemical etchant containing hydrogen peroxide and phosphate ions at a controlled pH is provided for selectively etching metals in the presence of one or more metals not to be etched. The etchant is useful in the fabrication of semiconductor components particularly for forming capture pads where TiW is used as a barrier layer for a copper, copper/nickel pad, or copper/nickel alloy pad. A commercial hydrogen peroxide solution is preferred to which has been added phosphoric acid as a source of phosphate ions and KOH as the pH adjuster.

8 Claims, 1 Drawing Sheet

SELECTIVE ETCH OF TIW FOR CAPTURE PAD FORMATION

BACKGROUND OF THE INVENTION

1. Field of the Invention

The present invention relates to the selective etching of metals, particularly the selective etching of TiW in microelectronics fabrication of capture pads for C4 solder bumps on electronic components.

2. Description of Related Art

Forming an electronic package assembly whereby an electrical component such as an integrated circuit chip is electrically and mechanically connected to a substrate, a card, or board, another chip or another electronic part is well-known in the art. This technology is generally termed surface mount technology (SMT) and has gained acceptance as the preferred means of making electronic package assemblies. The interconnect technology is known as ball grid array packaging, C4 flip chip interconnect, multi-chip modules, multilayer and micro via printed wiring boards and surface mount hybrid assembly. In one particular application, to which this application is directed to for convenience, a chip is electrically joined to a multilayer glass-ceramic electronic component and/or an organic substrate.

Multilayer glass-ceramic electronic components are typically joined to other components by soldering pads on a surface of one of the electronic components to corresponding soldering pads on the surface of the other component. Control Collapse Chip Connection is an interconnect technology developed by IBM as an alternative to wirebonding. This technology is generally known as C4 technology or flip chip packaging. Broadly stated, an integrated circuit chip is mounted above a glass-ceramic substrate and pads on the chip are electrically and mechanically connected to corresponding pads on the substrate by a plurality of electrical connections such as solder bumps to form an electronically connected module. A module is typically connected to other electronic components by solder or socket type connections.

In the C4 interconnect technology a relatively small solder hump is attached to the pads on one of the components being joined, typically to the chip. The electrical and mechanical interconnects are then formed by positioning the corresponding pads on the glass-ceramic substrate to be joined adjacent the solder humps on the chip and reflowing the bumps at an elevated temperature. The C4 joining process is self-aligning in that the wetting action of the solder will align the chip bump pattern to the corresponding pads on the glass-ceramic substrate.

A myriad of solder structures have been proposed for the surface mounting of one electronic component to another. Typical surface mount processes form the solder structures by screening solder paste on conductive, generally metallic pads exposed on the surface of a chip or substrate. The solder paste is reflowed in an inert atmosphere and wets the pad and brings the solder into a spherical shape. After alignment of corresponding pads the whole assembly goes through a reflow operation to form solder bonds. The interconnection made by joining components by an array of solder balls is termed a ball grid array (BGA). When the solder structure is in the form of a column, it is termed a column grid array (CGA). Land grid array (LGA) interconnection is used in socket type electronic assemblies.

In C4 technology the solder bumps ate formed directly on the metal pads of the one unit. The pads are electrically isolated from other pads by the insulating substrate that surrounds each pad. The substrate might be un-doped silicon (Si) or some other material. The bottom of the pad is electrically connected into the chip or substrate circuit.

A major application of C4 is in joining semiconductor microchips (integrated circuits) to chip packages. Chips usually are made in rectangular arrays on a mono-crystalline slab of silicon called a "wafer," which is a thin disc several inches across. Many chips are formed on each wafer, and then the wafer is diced into individual chips aid the chips are "packaged" in units large enough to be bandied. The C4 bumps are placed on the chips while they are still joined in a wafer.

C4 solder bumps must be mechanically well-fastened to their pads, or they may be torn off when the two surfaces are pushed together for electronical connection. It will be appreciated that a complex device such as a computer may have dozens of chips and hundreds or thousands of C4 solder ball connections, and the entire device may be rendered useless if only one of the bumps fails. The attachment of the C4 bumps requires careful design.

One method of forming solder bumps uses sputtering or vacuum deposition. Solder metal is evaporated in a vacuum chamber and the metal vapor coats everything in the chamber with a thin film of the evaporated metal. To form solder bumps on the substrate, the vapor is allowed pass through holes in a metal mask held over the substrate. The solder vapor passing through the holes condenses onto the cool surface into solder bumps. This method requires a high vacuum chamber to hold the substrate, mask, and flash evaporator.

An alternative technique for making solder bumps is electrodeposition, also called electrochemical plating or electroplating. This method also uses a mask such as patterned photoresist and forms solder bumps only at the selected sites.

Solder bump electrodeposition requires a first preliminary step, the creation of a continuous "seed layer" of conductive metal adhered onto a barrier layer on the insulating substrate. The seed layer is needed to deposit solder.

The second preliminary step, after the seed layer is laid down, is to form a mask by photolithography. A metal mask may also be used. For the photolithography method, a layer of photoresist is laid onto the seed layer and exposed to light. Unexposed photoresist can then be washed away to leave the cured photoresist behind as a mask.

When the exposed photoresist has been cured and the uncured photoresist has been removed, the mask is complete. The mask has rows of holes where the solder bumps are to be deposited.

The third step is preferably electrodeposition (electroplating) of copper to form a conductive pad and then to deposit metal alloy into the mask holes containing the copper pads. Solder can be directly deposited on the copper seed layer hut this is not preferred.

After the solder bumps are formed, the mask of cured photoresist is removed. The substrate now is covered with the continuous seed layer, copper pad, and numerous solder bumps on the copper pads. The seed layer between the solder bumps must now be removed to electrically isolate them. The removal can be done by chemical etching or by electroetching.

Capture pads for C4 bumps on semiconductor wafers for injection molded solder (IMS) transfer are preferably made by a through resist plating of Ni or Cu/Ni pads onto a Cu seed layer, it is also preferred to use a conductive barrier layer on the substrate surface and the Cu seed layer is preferably made by sputtering of Cu onto a sputtered TiW layer. After plating and resist stripping steps the Cu seed layer and TiW layer around capture pads need to be removed. The Cu seed layer can be removed by a conventional wet etch step. However, etching of exposed TiW layer around capture pads needs to be addressed since the complete removal of the TiW layer is important to eliminate shorts between bumps and is difficult to perform in the art.

An alternate method for preparing capture pads is to sputter layers of seed metal on to the substrate surface and using patterned photoresist and etching to form the capture pads. Cu seed layer is made by sputtering Cu onto a sputtered Ni, or NiCu alloy, on to a sputtered TiW layer. After resist application and develop, the capture pads are formed by etching Cu, Ni (or NiCu alloy), and TiW in the presence of resist. The Cu seed layer can be removed by a conventional wet etch, step, as is the Ni or NiCu alloy. Etching of exposed TiW layer is critical since residual TiW results in shorts between bumps.

The TiW etch chemistry used for etching of the TiW layer around C4 bumps convention ally consists of $H_2O_2$ (etchant), K2EDTA (bath stabilizer) and K2SO4 (corrosion protection for lead). This chemistry is used to etch TiW on wafers with electroplated C4 bumps with different solder composition (HTS, LTS, PbFree). Frequently, extensive TiW undercut is observed after the TiW etch step. It has been proposed that the undercut is caused by the presence of Cu in the BLM stack. It has been shown that having $K_2EDTA$ in the TiW etch bath greatly affects preferential TiW undercut. While $K_2EDTA$ presence can contribute to increased bath stability, it also accelerates Cu etch, thereby increasing concentration of Cu ions and accelerating TiW etch rate, causing TiW undercut.

Thus, it is an object of this invention to develop an etch chemistry for the removal of a TiW layer around capture pads, especially for C4NP wafers, which would not be sensitive to the presence of Cu in the BLM stack.

One solution to this problem is the use of a dry reactive ion etch (RIE) to remove the TiW layer. However, this technique is very sensitive to any surface contaminants including Cu residue that affects manufacturing yields.

U.S. Pat. No. 5,130,275 employs a barrier metal layer of 10% Ti and 90% W by weight coated over Al or gold (Au) interconnect pads and a passivating layer of $SiO_2$. A Cu or Au seed layer is coated over the barrier layer.

The TiW barrier layer is etched in an aqueous solution of 30% hydrogen peroxide and it is noted that peroxide can corrode the solder bead atop the Cu/Au bump and teaches prevention of corrosion by adjusting the pH of the solution to between 9 and 11 (basic). The preferred solution is 7% ammonium persulfate and 1% to 2% hydrogen peroxide, with the pH adjusted to between 9 and 11 by adding ammonium hydroxide.

A 10% Ti-90% W barrier layer is also taught by James Watson in U.S. Pat. No. 5,041,191. Watson's TiW etchant is 5 g of cupric sulfate ($Cu_2SO_4$), 10 ml ammonium hydroxide ($NH_4OH$), 100 ml glycerol, and 125 ml deionized water.

Stephen Pyke in U.S. Pat. No. 4,671,852, teaches a selective TiW etchant composed of 0.1 molar EDTA, 30% hydrogen peroxide, and concentrated ammonium hydroxide mixed in a respective volume ratio of 10:3:2. Pyke states that the pH should be less than 11 (not too basic).

U.S. Pat. No. 4,814,293, issued to Jacques Van Oekel, also teaches chemical etching of 10% Ti-90% W. It is noted that hydrogen peroxide causes inhomogeneous etching, and in particular, the undercutting or underetching, when TiW films are layered between other metals is irregular. The agitation commonly used is ineffective in reducing the uneven results, and the patent advocates stagnant liquid etchants. Van Oekel buffers the peroxide solution to a pH value between 1 and 6 (acidic) and the preferred buffering compounds are acetic acid and ammonium acetate. Citric acid and sodium hydroxide may also be used. The etch rate is varied with the pH.

Minford et al., in U.S. Pat. No. 4,554,050 teach the use of Ti etchants in fabricating waveguides and the etchant is composed of EDTA, water, hydrogen peroxide, and ammonium hydroxide. The pH is about 10. The etch rate is controlled by varying the OH concentration and the temperature.

Bearing in mind the deficiencies of the prior art it is an object of the present invention to provide an etchant composition for selectively etching a barrier layer such as TiW in the presence of other metals, such as Cu, Ni, CuNi, NiCu, used in the fabrication of microelectronic components such as Cu solder pad fabrication.

It is another object of the present invention to provide a method for selectively etching a barrier layer such as TiW in the fabrication of microelectronic components such as C4 solder pad fabrication.

Still other objects and advantages of the invention will in part be obvious and will in part be apparent from the specification.

SUMMARY OF THE INVENTION

The above and other objects, which will be apparent to those skilled in the art, are achieved in the present invention which is directed to a chemical etchant for etching metals (and/or alloys) in the presence of one or more metals (and/or alloys) not to be etched, the etchant comprising hydrogen peroxide and phosphate ions and the etchant having a controlled pH. More particularly, in the fabrication of solder interconnections for microchip structures, the present invention addresses the removal of intermediate adherent layers, e.g., TiW, without damaging other exposed layers, such as copper, copper/nickel pads, and copper nickel alloy pads that form the interconnection structure and copper seed layers. The use of a phosphate buffer in a hydrogen peroxide bath at a controlled pH has been found to significantly reduce the attack on the metal not to be etched.

In one aspect the invention relates to a chemical etchant for etching metals in the presence of one or more metals not to be etched, the etchant comprising:
 about 1 to 7 M $H_2O_2$, preferably about 1.5 to 3.6 M and most preferably about 2.5 to 3.5 M, e.g., 3 M;
 about 0.01 to 0.1 M phosphate ions, preferably about 0.025 to 0.075 M; and
 a pH of about 4-6, preferably 5 to 5.3.

In another aspect of the invention a method is provided for selectively dissolving in an article one or more metals to be dissolved in the presence of one or more metals not to be dissolved comprising the steps of:
 forming an aqueous solution comprising about 1 to 7 M $H_2O_2$, preferably about 1.5 to 3.6 M and most preferably about 2.5 to 3.5 M, e.g., 3 M, about 0.01 to 0.10 M phosphate ions, preferably about 0.025 to 0.075 M, the solution adjusted to have a pH of about 4-6, preferably 5 to 5.3;
 heating the solution to between 25° C. and 60° C., or higher, preferably 33 to 37° C.; and
 wetting the article with said solution so as to dissolve the said one or more metals to be dissolved.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1A-2F of the drawings in which like numerals refer to like features of the invention.

The present invention relates to a method for selectively etching (dissolving) metals and/or alloys, e.g., TiW, in the presence of one or more metals and/or alloys not to be etched e.g., copper pads, copper/nickel pads, copper/nickel alloy pads, and copper seed layers and to a chemical etchant used in the selective etching process. More specifically, the etchant (and its corresponding method) are useful in fabrication of a Cu/Ni capture pad. The pad is on a Cu seed layer which is on a TiW barrier layer, or is Cu seed layer on a NiCu or NiCu alloy layer on a TiW barrier layer.

Referring to FIGS. 2A-2F, a method of the prior art is shown for forming capture pads on a substrate.

Figure 1A:
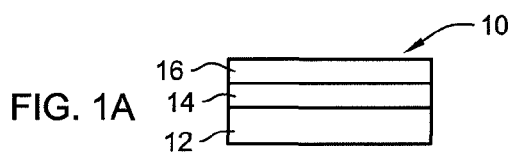
FIGS. 1A-1F are elevational, cross-sectional views of C4 capture pad formation by electroplating in accordance with the invention.
Figure 2A:
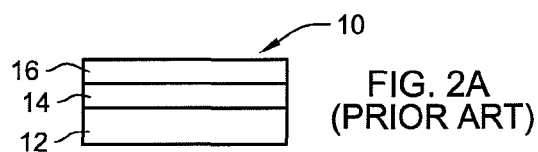
FIGS. 2A-2F are elevational, cross-sectional views of C4 capture pad formation by electroplating in accordance with the prior art.
Figure 1B:
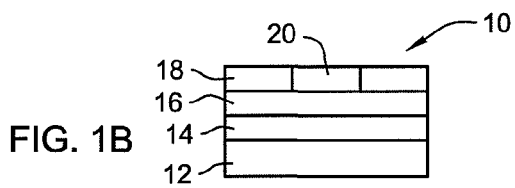
Figure 2B:
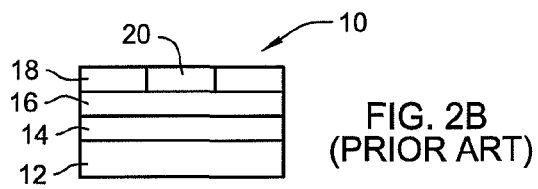
Figure 1C:
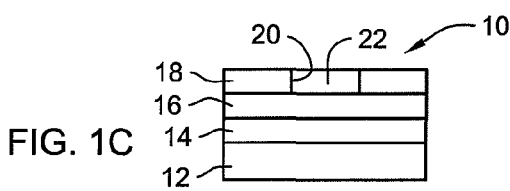
Figure 2C:
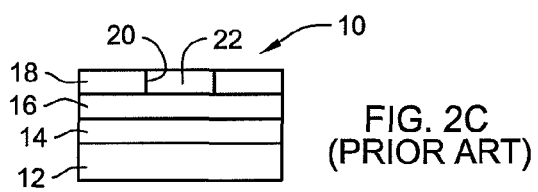
Figure 1D:
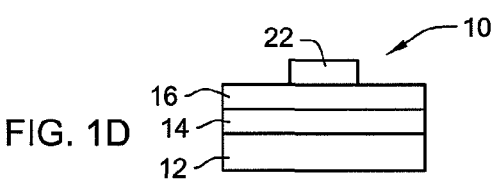
Figure 2D:
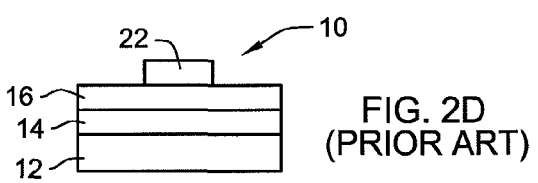
Figure 1E:
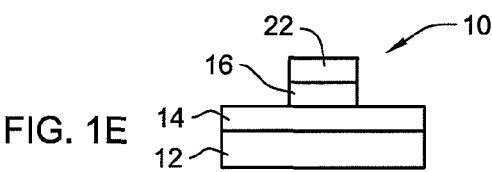
Figure 2E:
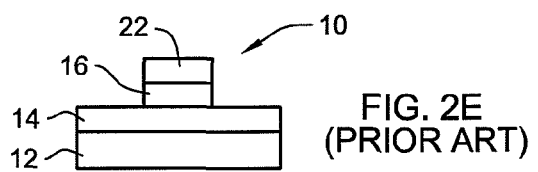
Figure 1F:
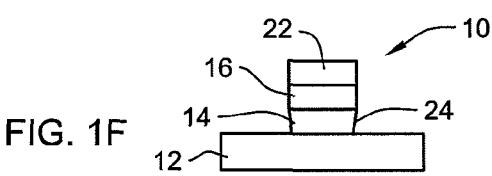
Figure 2F:
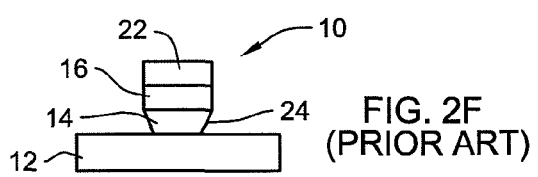

FIG. 2A shows a substrate 12 having a TiW layer 14 and a copper seed layer 16. A photoresist 18 having a pad opening 20 is shown in FIG. 2B. FIG. 2C shows a copper pad 22 formed in the opening. The photoresist is stripped in FIG. 2D and the copper seed layer 16 stripped in FIG. 2E. FIG. 2F shows the final structure whereby the TiW layer 14 was stripped leaving the capture pad 22 isolated in the substrate 12. Note that the TiW layer has been undercut 24 when the TiW layer was stripped. This is common in the industry and is the problem addressed by the subject invention.

This is shown in FIGS. 1A-1F which are the same as 2A-2F except that the composition and method of the invention were used to etch the TiW layer. Note that the amount of TiW undercut is significantly less than the undercut in the prior art.

Since TiW adheres well to both the substrate and copper, it can act as both a barrier layer and as part of the seed layer.

However, the TiW must eventually be removed since it is conductive and would short out the solder bumps. For the TiW film to be useful it must be possible to selectively dissolve it without damaging structures made of other metals, such as the Cu or Cu/Ni or Cu/Ni alloy layer.

The present invention particularly addresses the removal of TiW without damage to microchip structures of Cu/Ni capture pads and without significant undercutting of the TiW layer which night cause loss of adhesion of the pad and/or structural integrity of the solder bump.

To demonstrate the etching process of the invention, experimental sample wafers were prepared and etched. The wafers were sputter deposited with TiW approx. 0.2 µm thick, a sputtered seed Cu layer 0.43 µm (4300 Å) thick and a 1 µm of Ni and 2 µm of deposited copper pad.

The wafers were etched to remove sputtered Cu seed layer while the TiW remained passive, and so was not attacked. This step left the TiW seed layer exposed. Thereafter, the TiW was etched in solutions according to the present invention.

To demonstrate the etching process of the invention, other experimental sample wafers were prepared and etched. The wafers were sputter deposited with TiW approx 0.2 µm thick, sputtered Ni or NiX alloy approx. 2.0 µm thick, and a sputtered Cu layer 0.43 µm (4300 Å) thick.

Photoresist pads act as a mask for Cu etching. The wafers are etched to remove the sputtered Cu seed layer. They are then etched to remove the Ni or NiX alloy seed layer, which exposes the TiW layer. When these two layers are removed, the wafers are stripped of the resist pads. Thereafter, the TiW was etched in solutions according to the present invention.

The etchant of this invention comprises an aqueous solution of $H_2O_2$, phosphate ions and a pH of about 4-6. Broadly stated, the $H_2O_2$ is preferably about 5%-12% (1.5-3.6 M), or higher, the phosphate ions about 0.01-0.1 M, or higher, and the pH about 4-6.

The preferred etchant of this invention comprises about 2.5-3.5 M $H_2O_2$, most preferably about 3 M $H_2O_2$ (about 10.2%) and 0.025-0.075 M phosphoric acid and the etchant adjusted to a pH of 4-6, preferably 5-5.3 with KOH. The etchant is preferably used at a temperature between 25° C., and 60° C., most preferably 33-37° C., although lower and higher temperatures may be used.

Hydrogen peroxide is a strong oxidizing agent and is marketed as a solution in water in concentrations of 3-90% by wt. Hydrogen peroxide solutions completely free from contamination are highly stable and a low percentage of an inhibitor such as acetanilide or sodium stannate is usually added to counteract the catalytic affect of traces of impurities such as iron, copper, and other heavy metals. To make the etchant composition in this invention, it is preferred to dilute a 30% by wt. solution of hydrogen peroxide with deionized water and add phosphate ions to the solution and adjust the pH of the hydrogen peroxide solution to form the etchant of the invention. The concentration of the hydrogen peroxide in the etchant composition can vary and is preferably between about 5%-12% (1.5 and 3.6 M) and most preferably between about 9%-11%, e.g., 10.2% (3M).

The phosphate ions may be added by any suitable source and phosphoric acid is preferred because of its demonstrated effectiveness. The phosphate ions are present in an amount of about 0.01-0.1 M, preferably 0.025-0.075 M.

The pH of the solution is adjusted to between about 4 and 6 and it is preferred to adjust the pH with potassium hydroxide because of its demonstrated effectiveness. Other pH adjusting materials include NaOH and $NH_4OH$. Likewise, other phosphate ion containing materials which may be used in the invention include $K_3PO_4$, $K_2HPO_4$, and $KH_2PO_4$.

The etchant of the invention does not significantly attack Cu. It has been found for one etchant composition that the copper etch rate is about 20 Å/min. whereas the TiW etch rate is 300 Å/min. It can be used with dip etching, which allows economical production with a simple throughput cassette-type etching process.

The method and etchant of the present invention resulted in the removal of the TiW layer so that no shorts were obtained between the pads. Inspection and shear tests of the finished C4 solder bumps indicated that there was no significant Cu or Ni attack and no delamination between the seed layers, the solder bumps, aid the substrate. There was minimal TiW undercut.

Subsequent to the TiW etching, removal of reaction products that adhere to C4s is high preferred for obtaining desired reflow characteristics. A methyl sulfonic acid solution in water (1-10% by weight) has been successfully employed to obtain clean C4 and substrate surfaces.

The etching process of this invention is applicable to other pad layers such as TiW/Ni, TiW/Co, TiW/Cu/NiP, TiW/NiV, TiW/NiV/Cu, TiW/NiSi, TiW/NiSi/Cu, and other Ni and Cu alloys that are compatible with the solder C4s.

While the present invention has been particularly described, in conjunction with a specific preferred embodiment, it is evident that many alternatives, modifications aid variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A chemical etchant for etching titanium-tungsten alloys in microelectronics fabrication of capture pads for C4 solder bumps in the presence of one or more metals not to be etched, the etchant consisting essentially of:
    an aqueous solution maintained at a temperature between about 25° C. and 60° C. comprising;
    about 5% to 12% by weight of solution of $H_2O_2$;
    about 0.06% to 0.6% by weight of solution of phosphate ions;
    an amount of a pH adjusting material to provide the aqueous solution with a pH of about 4-6; and
    the balance $H_2O$,
    wherein said aqueous solution does not etch one or more metals selected from the group consisting of copper, copper/nickel, and copper/nickel alloys.

2. The chemical etchant of claim 1 wherein the phosphate ions comprise phosphoric acid ions.

3. The chemical etchant of claim 1 wherein the phosphate ions are selected from a material from the group consisting of $K_3PO_4$, $K_2HPO_4$ and $KH_2PO_4$.

4. The chemical etchant of claim 1 wherein the pH adjusting material comprises KOH.

5. The chemical etchant of claim 1 wherein the pH adjusting material is selected from the group consisting of NaOH and $NH_4OH$.

6. The chemical etchant of claim 1 wherein the aqueous solution is maintained at a temperature between about 33° C. and 37° C. comprising.

7. The chemical etchant of claim 1 wherein the $H_2O_2$ is present in an amount from about 8% to 11% by weight of solution.

8. The chemical etchant of claim 7 wherein the phosphate ions are present in an amount from about 0.145% to 0.435% by weight of solution.

* * * * *